United States Patent [19]

Neumann et al.

[11] Patent Number: 4,778,974

[45] Date of Patent: Oct. 18, 1988

[54] ELECTRON BEAM LINE EVAPORATOR

[75] Inventors: Manfred Neumann; Siegfried Schiller; Henry Morgner; Peter Unganz, all of Dresden, German Democratic Rep.

[73] Assignee: Bakish Materials Corporation, Englewood, N.J.

[21] Appl. No.: 37,662

[22] Filed: Apr. 13, 1987

[51] Int. Cl.⁴ ............................................. B23K 15/00
[52] U.S. Cl. .................................. 219/121.15; 373/14; 373/13
[58] Field of Search .................. 219/121 EE, 121 EF, 219/121 EV; 373/10, 11, 12, 13, 14

[56] References Cited

U.S. PATENT DOCUMENTS 4,524,717 6/1985 Neumann et al. ....... 219/121 EE X
4,532,888 8/1985 Neumann et al. ....... 219/121 EE X

FOREIGN PATENT DOCUMENTS 64107 3/1970 German Democratic Rep. .
54154 4/1970 German Democratic Rep. .
204947 12/1983 German Democratic Rep. .
208995 4/1984 German Democratic Rep. .

Primary Examiner—C. L. Albritton
Attorney, Agent, or Firm—Nolte, Nolte & Hunter

[57] ABSTRACT

An electron beam line evaporator for coating heat-sensitive strips or substrates includes a magnetic trap overlying an evaporation crucible to prevent unpermissible heating and static electrification by back-scattered electrons, complemented with means to influence the injection angle of a dynamically deflected electron beam in such a manner that the beam enters the horizontal magnetic field of the trap at the same angle in each deflection phase independent of stray fields. Such means are arranged inside a gap of a pole shoe necessary for the horizontal magnetic field used by the trap and are operative to generate a vertical magnetic field variable in time and locally alongside the pole shoe.

5 Claims, 1 Drawing Sheet

ELECTRON BEAM LINE EVAPORATOR

BACKGROUND OF THE INVENTION

The present invention concerns an electron beam line evaporator for coating heat-sensitive broad strips or other heat-sensitive substrates by means of an electron beam as they are moved perpendicular to the longitudinal dimension of the line evaporator. It is preferably applied to the coating of thin plastics sheeting and papers where the back-scattered electrons could cause unpermissible high warming-up and/or static electrification.

The electron beam line evaporators already known are characterized by the deflection of an electron beam along a line on the surface of evaporation material in an elongated evaporation crucible in a dynamic manner. Furthermore, it is known to place a magnetic trap between the evaporation crucible and the substrate to be coated for preventing the electrons back-scattered at the evaporation material from reaching the substrate. Generally, the magnetic trap is implemented by a horizontal magnetic field which deflects the bombarding electron beam as well as the back-scattered electrons. In such an arrangement, the electron beam enters the horizontal magnetic field either almost perpendicular to the direction of the magnetic field lines (German Democratic Republic patent specifications Nos. 54154 and 64107) or at an angle to the field lines (German Democratic patent specification No. 204947).

The injection of the electron beam almost perpendicular to the field lines is a very simple solution, but cannot give reliable protection from back-scattered electrons for very broad substrates, because the magnetic field strength has to be relatively small in order that the primary electron beam can penetrate the extended magnetic field.

If the electron beam is injected at an angle to the field lines through one of the two pole shoes generating the horizontal magnetic field, an essentially higher field strength can be applied in order to guarantee reliable protection of the substrate from back-scattered electrons. Realization of such a highly efficient magnetic trap, however, involves the problem that the electron beam in each deflection phase must enter the horizontal magnetic field at the same angle relative to the field lines if a straight deflection line shall be formed.

For solving this problem, it has heretofore been proposed to place a magnetic sector filed between the electron beam gun and the horizontal magnetic field (German Democratic Republic patent specification No. 204 947). There, the field strength and the position of the inlet edge of the sector field are chosen in such a manner that in each deflection phase the electron beam leaves the sector field and enters the horizontal magnetic field at the same angle. For coating very broad substrates by means of this magnetic trap, it has also been proposed to install a deflection chamber between the electron beam gun and the sector field (German Democratic Republic patent specification No. 208 955). In such an installation, the vacuum near the beam is improved and misdeflections of the electron beam by stray fields are avoided.

These recommended solutions for realizing a highly-efficient magnetic trap using an angular injection of the electron beam with the help of a magnetic sector field have the disadvantage that a high constancy of the field strength of the magnetic sector field is required for attaining a straight deflection line at the evaporation crucible. Because of the large spatial extent of the sector field, this requirement cannot be fulfilled sufficiently. Besides, the field strength of the sector filed is about ten times smaller than that of the adjacent horizontal magnetic field, and non-uniform stray fields of the horizontal magnetic field can affect the sector filed. These stray fields can bend the deflection line and, thus, the vapor stream will be distributed unevenly over the strip breadth.

SUMMARY OF THE INVENTION

It is the object of the present invention to surmount the disadvantages of the state of the art and to provide an electron beam line evaporator using a highly-efficient magnetic trap and having a deflection line of high quality for attaining optimal uniformity of the coating thickness.

The present invention is based on the problem of providing an electron beam line evaporator having a magnetic trap wherein a dynamically deflected electron beam from an electron beam gun is injected through a gap in one of two pole shoes between which a horizontal magnetic field of the magnetic trap is generated, and wherein the injection angle of the electron beam can be influenced in such a way that in each deflection phase the electron beam enters the horizontal magnetic field at the same angle even if there are irregular stray magnetic fields variable in time between the electron beam gun and the horizontal magnetic field.

According to the invention, the problem is solved by utilizing an elongated evaporation crucible, an electron beam gun having dynamic beam deflection and a magnetic trap having a horizontal magnetic field overlying the evaporation crucible, and by arranging, within the pole shoe gap through which the dynamically deflected electron beam is injected into the horizontal magnetic field, means for generating a vertical magnetic field variable in time and locally. Thus, the angle of the electron beam injection into the horizontal magnetic field can be influenced at will along the evaporation crucible and, notwithstanding local and temporal irregularities, always be set in such a manner that a straight deflection line will be formed along the central line of the evaporation crucible.

Preferably, the vertical magnetic field variable in time and locally is generated inside the pole shoe gap by arranging one horizontal pole shoe plate at the upper side and one at the lower side of the pole shoe gap, both plates being connected with the gapped pole shoe via several soft magnetic cores wound with exciting coils. The cores for the upper pole shoe plate and the lower pole shoe plate are localized exactly one above the other. The exciting coils installed on two superimposed cores are passed by the same current in the same direction. As a great surprise, notwithstanding each pole shoe plate being of one-piece construction not subdivided by gaps, it is possible to generate a locally variable vertical magnetic field between these plates. This can be attained by the superimposed coils passing the same current, while the coils lying side by side are caused to pass different currents. In such a manner, it is even possible to reverse the field direction within the same pole shoe plates. Besides, it is possible to form always a straight deflection lines along the central line of the evaporation crucible by varying the coil currents correspondingly if the stray magnetic fields are variable with time.

For avoiding undesired beam deflections or beam distortions when passing the pole shoe gap, it is advantageous to orient and to form the boundary edge of the pole shoe gap at the electron gun side in such a away that the electron beam in each deflection phase enters the pole shoe gap at an angle $\beta$ of incidence between 60° and 90° toward the boundary edge.

DESCRIPTION OF PREFERRED EMBODIMENT

Figure 1:
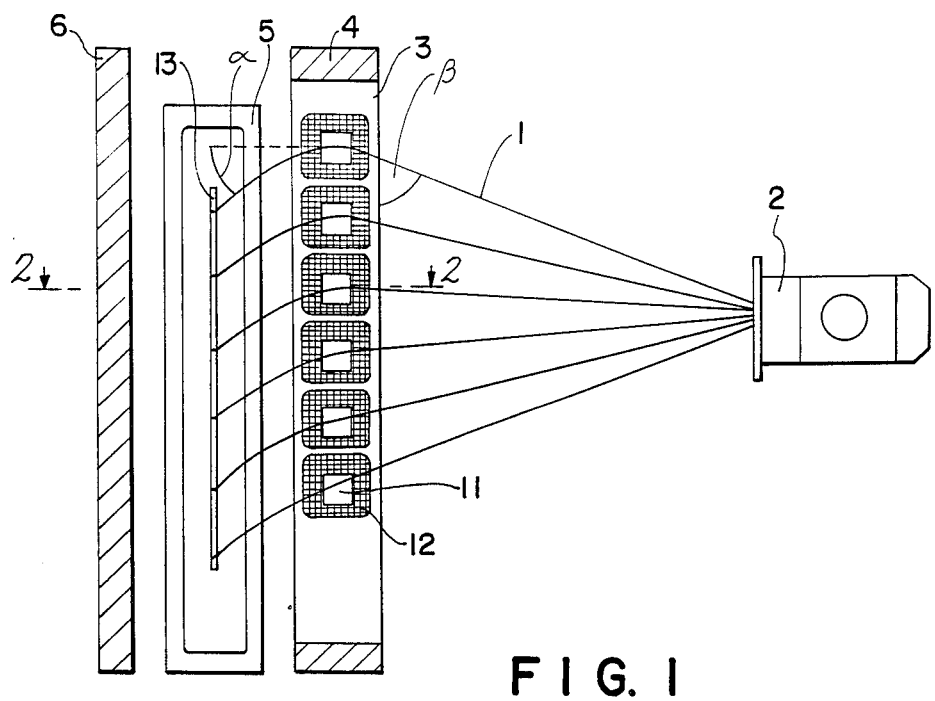
FIG. 1 is a horizontal section through an electron beam line evaporator having a magnetic trap and with the electron beam gun arranged perpendicular to the longitudinal direction of the evaporator crucible.

FIG. 1 shows the path of a dynamically deflected electron beam 1 in various deflection phases from a horizontally arranged electron beam gun 2 through a gap 3 of a pole shoe 4 toward the surface of the elongated evaporation crucible 5. On the opposite side of evaporation crucible 5, a second pole shoe 6 for generating a horizontal magnetic field 7 of a magnetic trap has been installed. In this example, electron beam gun 2 has been placed perpendicular to the longitudinal axis of evaporation crucible 5, but it can also be placed at an angle. In the depicted arrangement, electron beam 1 enters pole shoe gap 3 at an angle of incidence $\beta$ between 60° and 90°.

Figure 2:
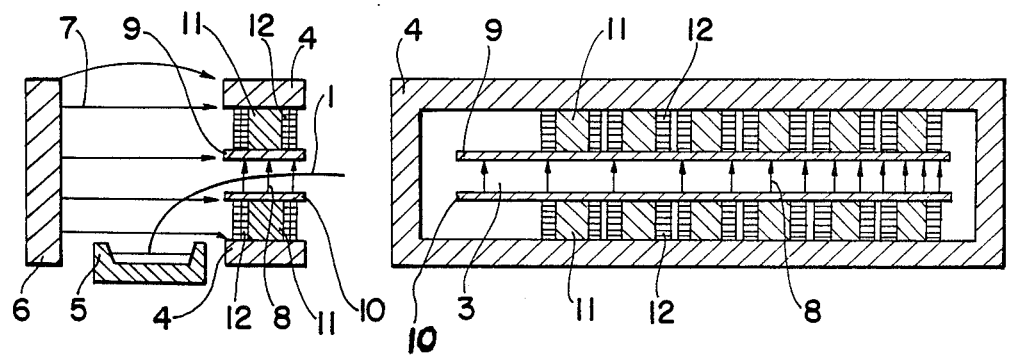
FIG. 2 is a vertical section through the electron beam line evaporator of FIG. 1 perpendicular to the longitudinal direction of the crucible.
Figure 3:
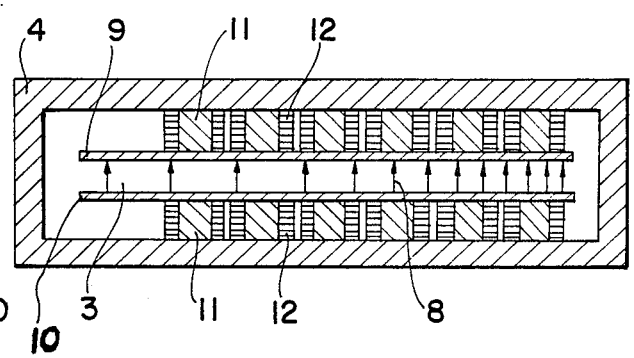
FIG. 3 is a vertical section through the gapped pole shoe of the electron beam line evaporator of FIG. 1.
Figure 4:
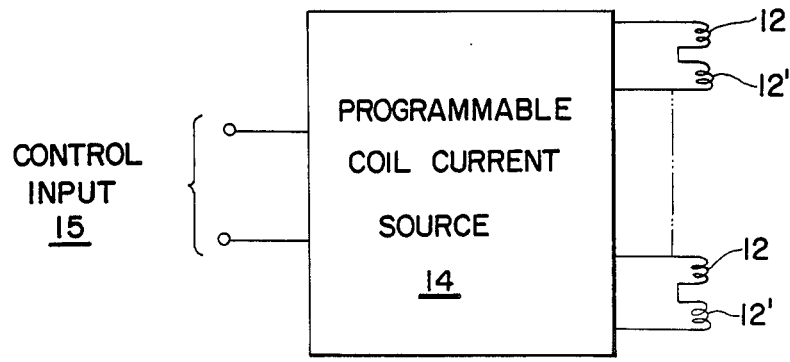
FIG. 4 is a diagrammatic schematic representation of the arrangement of coil pairs of superimposed cores for programmed excitation.

FIGS. 2 and 3 illustrate the generation of a locally variable vertical magnetic field 8 inside pole shoe gap 3 by means of an upper pole shoe plate 9 and a lower pole shoe plate 10, soft magnetic cores 11 and exciting coils 12 on the cores. Cores 11 for upper and lower pole shoe plates 9 and 10 are arranged exactly one above the other, and exciting coils 12 wound on two superimposed cores 11 are connected in series and are passed by the same current in the same direction, as indicated in FIG. 4. In such a way, different vertical magnetic fields 8 can be attained and adjusted in the spaces of the superimposed cores 11 with exciting coils 12, where the value of the field strength varies continuously from one space to the other, without necessitating any subdividing of pole shoe plates 9, 10 by narrow lateral gaps. Reverting to FIG. 4, all the pairs of superimposed exciting coils 12 are excited by a suitable programmable coil current source 14 responsive to appropriate signals supplied to its control input 15 in such a manner that, in the space of these exciting coils, electron beam 1 will be deflected in the horizontal plane in the desired manner. Thus, it is obtained that in each deflection phase, i.e., in the space of each exciting coil pair, electron beam 1 enters the horizontal magnetic field 7 at the same angle $\alpha$ and that a straight deflection line 13 is formed along the central line of evaporation crucible 5. In the case of misdeflections or their temporal variations by magnetic stray fields between electron beam gun 2 and evaporation crucible 5, bendings of deflection line 13 caused by the stray fields can be compensated by the variation of the coil currents, too.

While a preferred embodiment has been described above, it is intended that such embodiment be interpreted as illustrative and not as limitative of the scope of the present invention defined in the appended claims.

What is claimed is:

1. In an electron beam line evaporator comprising an elongated evaporation crucible (5), an electron beam gun (2) having dynamic beam deflection, and a magnetic trap having two pole shoes (4, 6) arranged above and extending along respective sides of the evaporation crucible for providing a horizontal magnetic field (7) used by said trap and into which the dynamically deflected electron beam (1) is injected at the same injection angle ($\alpha$) in each deflection stage by way of an elongated gap (3) in one (4) of the pole shoes, the improvement wherein:

there are disposed, within said pole shoe gap (3), means (9, 10, 11, 12) for generating along the gap length a plurality of individually adjustable local vertical magnetic fields, to interact with said dynamically deflected electron beam (1) as it is swept through said gap, said means being arranged to facilitate the injection of said electron beam into said horizontal magnetic field (7) at the same injection angle ($\alpha$) in each deflection stage for obtaining a straight deflection line of the beam along the central line of the elongated evaporation crucible.

2. An electron beam line evaporator according to claim 1, wherein said vertical magnetic field generating means (9, 10, 11, 12) comprises an opposed pair of vertically spaced parallel pole shoe plates (9, 10), each plate being of one-piece construction and being magnetically connected with said one pole shoe (4) by way of a respective plurality of soft magnetic cores (11) having exciting coils (12) wound thereabout.

3. An electron beam line evaporator according to claim 2, wherein the soft magnetic cores (11) magnetically interconnecting the upper and lower pole shoe plates (9, 10) with said one pole shoe (4) are localized exactly one above the other as superimposed pairs, and wherein the exciting coils (12) wound on each superimposed pair of cores (11) are electrically connected to conduct the same current in the same direction.

4. An electron beam line evaporator according to claim 3, wherein a multiple output coil current source (14) is connected at each output thereof to a respective pair of the electrically connected exciting coils (12), said source (14) being operable to energize each coil pair with such coil current that local vertical magnetic fields are generated between said upper and lower pole shoe plates (9, 10) which cause the dynamically deflected electron beam (1) to enter said horizontal magnetic field (7) from said one pole shoe (4) at said same injection angle ($\alpha$).

5. An electron beam line evaporator according to claim 4, wherein said electron beam gun (2) is so oriented with respect to said one pole shoe (4) that the dynamically deflected electron beam (1) enters each local vertical magnetic field (8) within said elongated pole shoe gap (3) at an angle ($\beta$) of incidence between 60° and 90° to the long dimension of said gap (3).

* * * * *